US006924698B2

(12) United States Patent
Camnitz et al.

(10) Patent No.: US 6,924,698 B2
(45) Date of Patent: Aug. 2, 2005

(54) POWER DETECTOR FOR MISMATCHED LOAD

(75) Inventors: Lovell H. Camnitz, Santa Clara, CA (US); Bartholomeus Hendrik Jansen, San Jose, CA (US); Ray Myron Parkhurst, Jr., Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/633,191

(22) Filed: Jul. 31, 2003

(65) Prior Publication Data

US 2005/0024137 A1 Feb. 3, 2005

(51) Int. Cl.[7] ............................................... H03G 3/20
(52) U.S. Cl. ........................ 330/140; 330/129; 330/285
(58) Field of Search ............................ 330/85, 96, 129, 330/140, 278, 279, 285, 297

(56) References Cited

U.S. PATENT DOCUMENTS 6,081,161 A * 6/2000 Dacus et al. ................. 330/297
6,430,402 B1 * 8/2002 Agahi-Kesheh ............. 330/285

* cited by examiner

*Primary Examiner*—Khanh V. Nguyen
(74) *Attorney, Agent, or Firm*—Pamela Lau Kee

(57) ABSTRACT

A method for measuring the forward power output of an amplifier with improved accuracy with a mismatched load based on probing the amplitude of the AC voltage and current in the final amplifier stage. Amplitudes are combined resulting in a composite reading that is affected less by load mismatch. Variations include measuring signal amplitude at two points 90 degrees apart in the transmission medium and measuring the power supply voltage and current of a saturated amplifier.

4 Claims, 6 Drawing Sheets

POWER DETECTOR FOR MISMATCHED LOAD

BACKGROUND

As cellular phones have increased in popularity, manufacturers are including additional functionality, e.g. photography, email, and addressbook. These added features are required to fit into a housing that comfortably fits in a hand. As a result, designers are driven to use the interior space of the housing as efficiently as possible.

One way improve the use of the interior space of a cellular phone housing is to evaluate the efficiency of existing circuitry, e.g. RF power detection. FIG. 1 illustrates a prior art example for detecting RF power. A directional coupler, e.g. a passive structure, is placed between the amplifier and the load. The coupler diverts ~1% of the forward power to the voltage detector, passing most of the power through to the load. The coupler rejects reflections or reverse power. Thus, the voltage measurement depends on only the incident forward power, a desirable feature. The coupler, however, introduces power loss and is a physically large component in the circuit, having a size that depends upon the operating wavelength.

FIG. 2 illustrates another prior art technique. The voltage detector is directly connected to the amplifier output. This circuit has less loss and smaller size than the coupler circuit of FIG. 1, but the detected voltage is affected by the reflected power from a mismatched load. The power indication will be inaccurate when the load is mismatched.

SUMMARY

A method for measuring the forward power of an amplifier with improved accuracy with a mismatched load based on probing the amplitude of the AC voltage and current in the final amplifier stage. Amplitudes are combined resulting in a composite reading that is affected less by load mismatch. The fundamental principle behind the invention is that the detected voltage and current tend to vary in opposite directions from the nominal values as the load deviates from a nominal matched load. This invention provides the advantage of improved measurement accuracy without the cost or size of a directional coupler. Variations include measuring the signal at two points 90 degrees apart in the transmission medium and measuring both the power supply voltage and current of a saturated amplifier (i.e. an amplifier that delivers the full supply voltage to the load.)

In one embodiment, an amplifier including a current detector, connects to a voltage detector and a matching circuit. A load interposes the matching circuit and ground. An analyzer receives the outputs of the voltage detector and current detector. The analyzer scales the outputs of the voltage and current detectors in a ratio such that they would be equal under nominal load conditions, then adds them together. The analyzer output reflects the amplitude of the forward power. An optional gain control may receive the analyzer output and apply it to the amplifier.

In another embodiment, an amplifier has an output connecting to a first passive network. A first voltage detector connects to the amplifier output. A second passive network serially connects between the first passive network and a load. A second voltage detector connects to the output of the first passive network. The load is further connected to ground. An analyzer receives the outputs of the two voltage detectors. The analyzer multiplies the outputs of the two voltage detectors to reflect the total power. An optional gain control may receive the analyzer output and apply it to the amplifier.

In another embodiment, an amplifier has an output connecting to a matching network. The matching network connects to a load. The load is further connected to ground. A power supply connects to the amplifier. A voltage detector and current detector monitor power supply draw. The power supply draw of the amplifier reflects the AC voltage and current under the conditions of class B or C operation and amplifier power saturation. An analyzer receives the outputs of the voltage detector and current detector. The analyzer scales the outputs of the voltage and current detectors in a ratio such that they would be equal under nominal load conditions, then adds them together. The analyzer output reflects the amplitude of the forward power. An optional controller may receive the analyzer output and apply it to the power supply to control the forward power.

DETAILED DESCRIPTION

A method for measuring the forward power of an amplifier with improved accuracy with a mismatched load based on probing the amplitude of the AC voltage and current in the final amplifier stage. Amplitudes are combined resulting in a composite reading that is affected less by load mismatch. Variations include measuring signal at two points 90 degrees apart in the transmission medium and controlling the power supply of a saturated amplifier.

Figure 1:
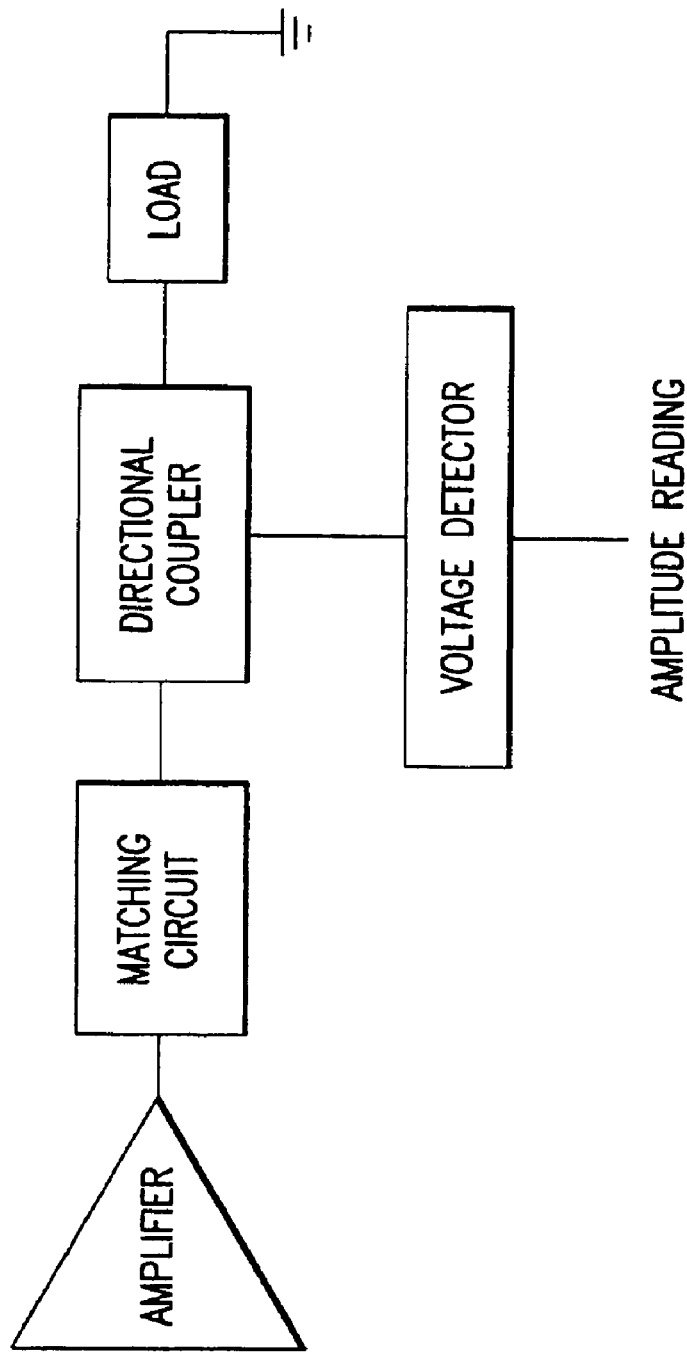
FIG. 1 illustrates a prior art example with a directional coupler and voltage detector.
Figure 2:
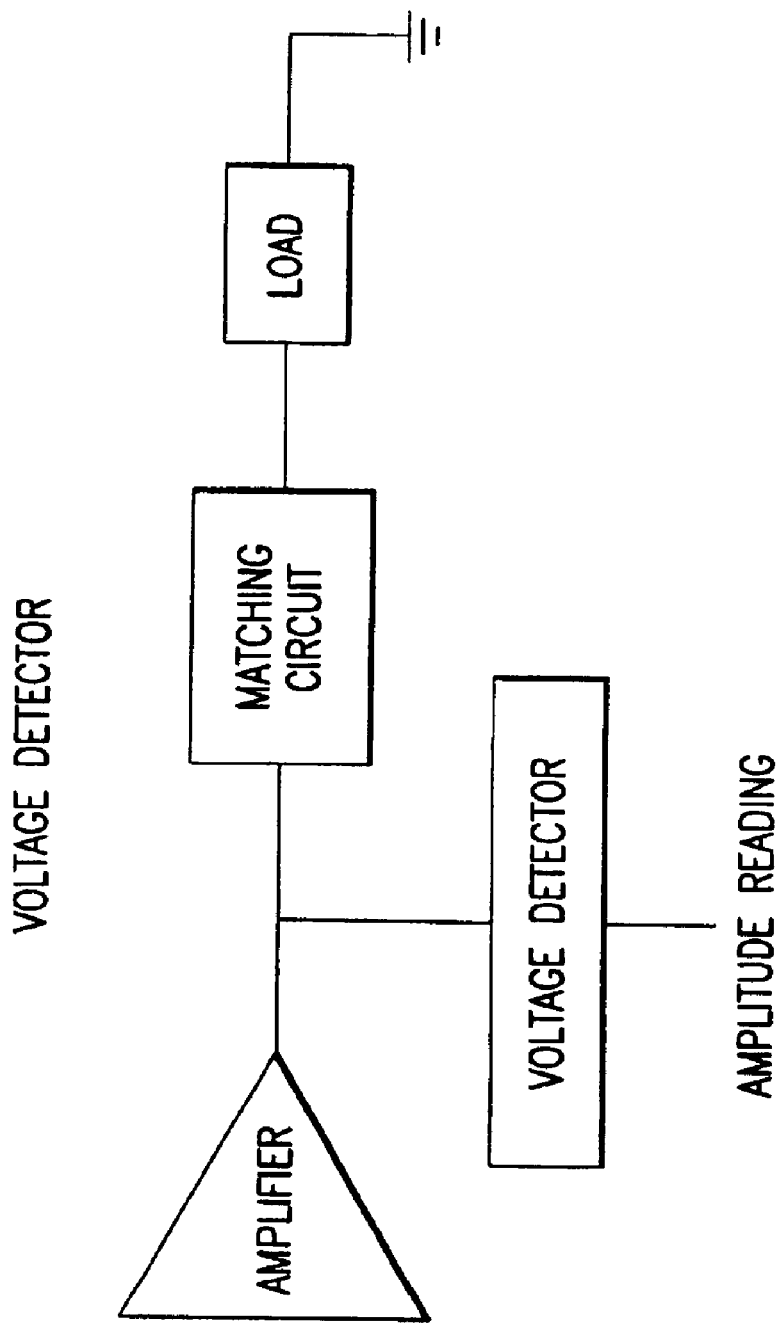
FIG. 2 illustrates a prior art example with a voltage detector.
Figure 3:
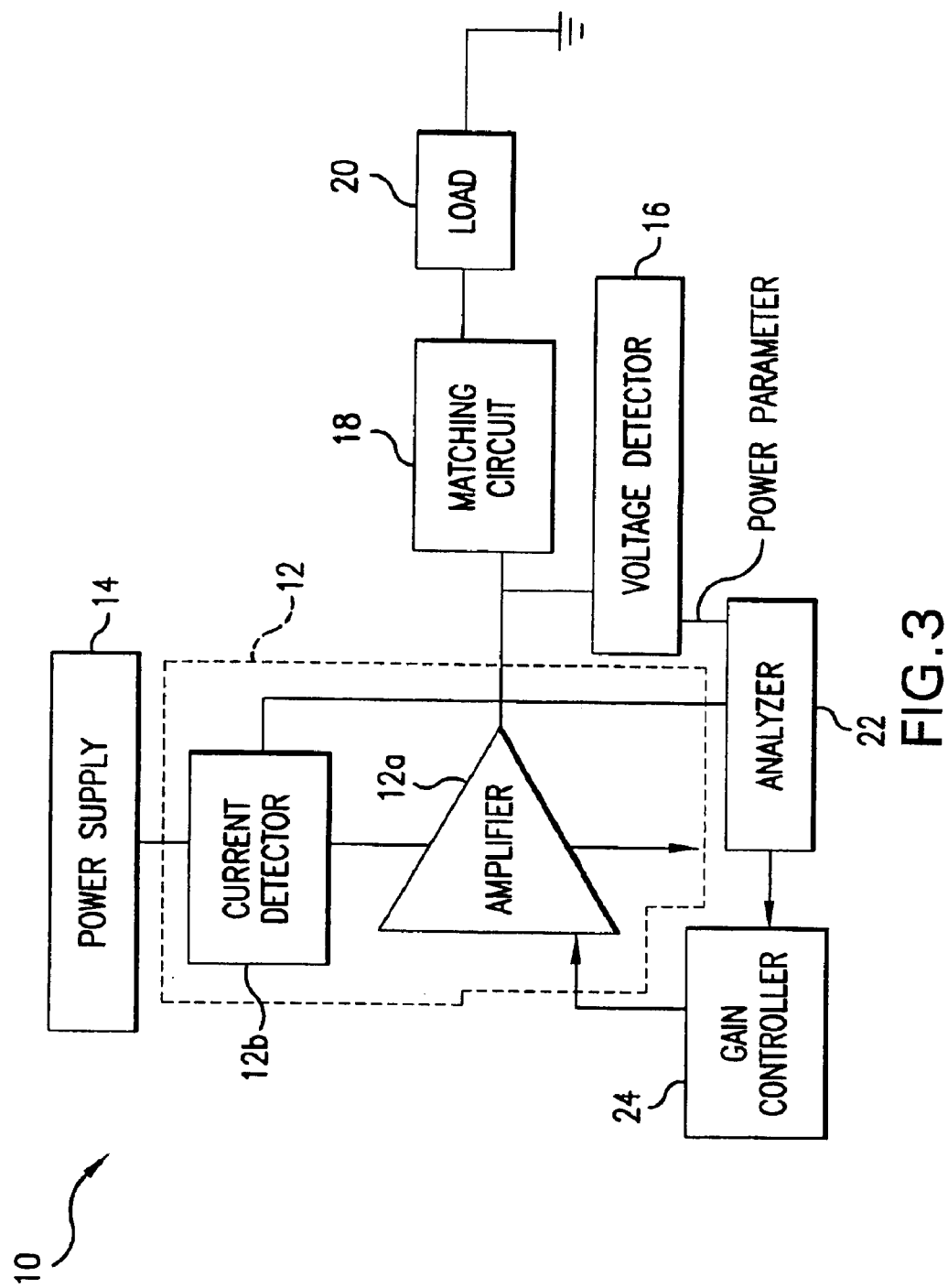
FIG. 3 illustrates an embodiment of the present invention.

FIG. 3 illustrates a functional block diagram 10 of one embodiment of the present invention. An amplifier block 12 that includes an amplifier 12a and a current detector 12b, connected between the power supply 14 and ground, connects to a voltage detector 16 and a matching circuit 18. The voltage detector 16 further connects to ground. A load 20 interposes the matching circuit and ground. An analyzer 22 receives the outputs of the voltage detector 16 and current detector 12b. The analyzer output reflects either the total power or the amplitude of the power. An optional gain controller 24 may receive the analyzer output and apply it to the input of the amplifier 12a.

Figure 4:
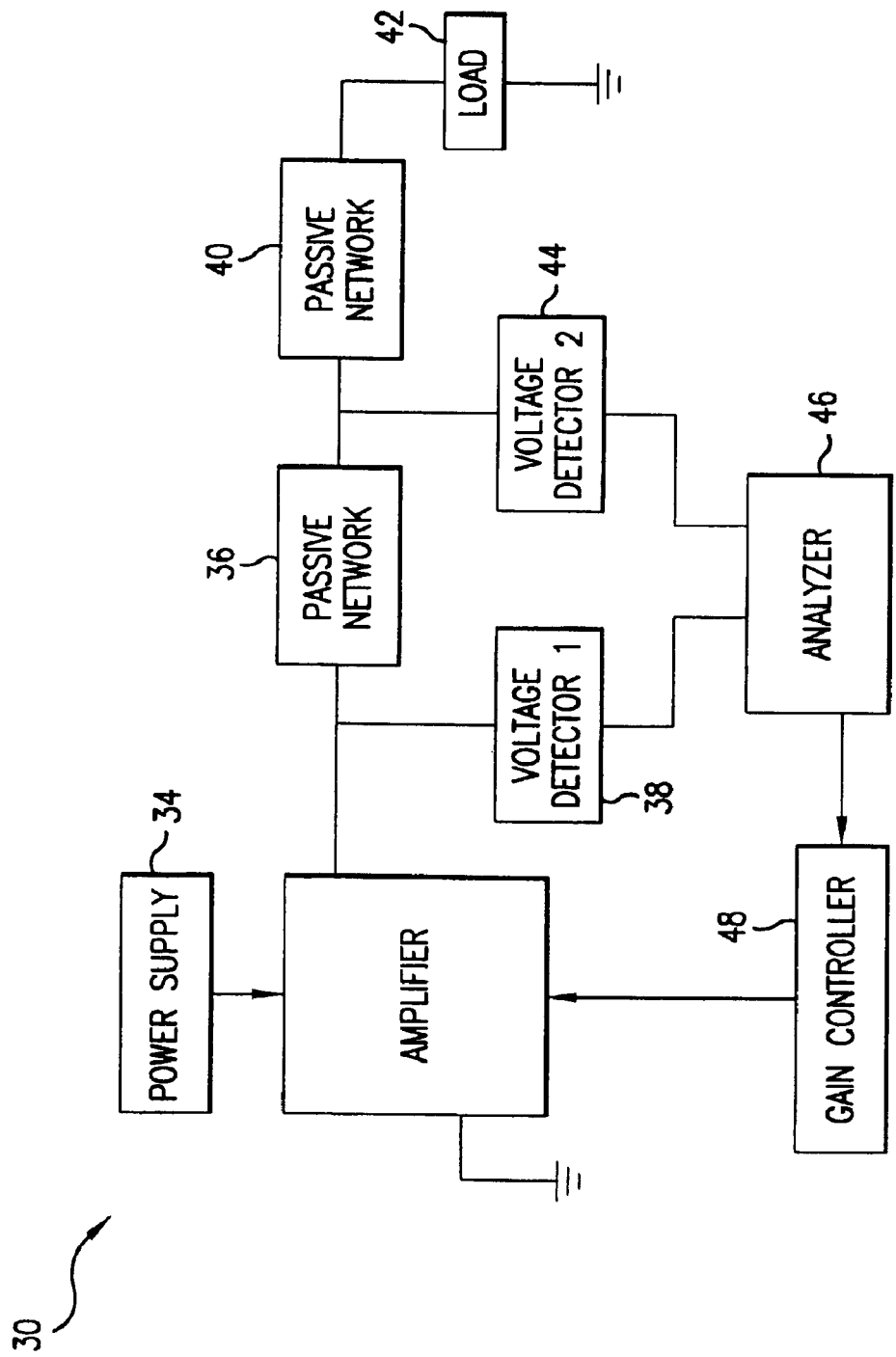
FIG. 4 illustrates a functional block diagram for another embodiment of the invention.

FIG. 4 illustrates a functional block diagram 30 for another embodiment of the invention. An amplifier block 32 connects between a power supply 34 and ground. The amplifier 32 further has an output connecting to a first passive network 36. A first voltage detector 38 connects to the amplifier output and ground. A second passive network 40 serially connects between the first passive network 36 and a load 42. A second voltage detector 44 connects to the output of the first passive network 36. The load 42 is further connected to ground. An analyzer 46 receives the outputs of the first voltage detector 38 and the second voltage detector 44. The analyzer output reflects either the total power or the amplitude of the power. An optional gain controller 48 may receive the analyzer output and apply it to the input of the amplifier 32.

Figure 5:
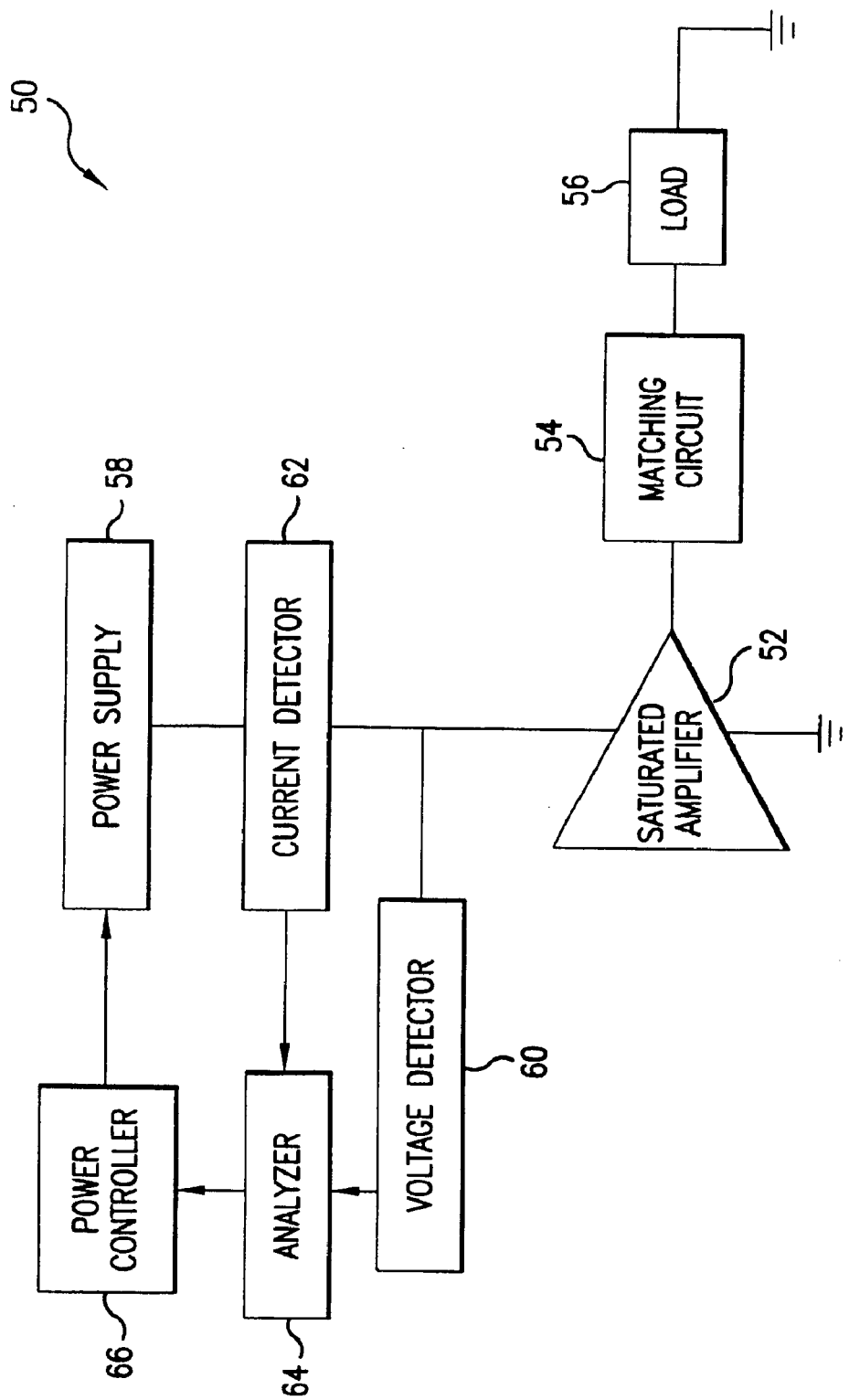
FIG. 5 illustrates a functional block diagram for another embodiment of the invention.

FIG. 5 illustrates a functional block diagram 50 for another embodiment using a saturated amplifier. The saturated amplifier 52 has an output connecting to a matching network 54. The matching network 54 connects to a load 56. The load 56 is further connected to ground. A power supply 58 connects to the amplifier 52. A voltage detector 60 and a current detector 62 monitor power supply draw. The power supply draw of the amplifier 52 reflects the AC voltage and current under the conditions of class B or C operation and amplifier power saturation. An analyzer 64 receives the outputs of the voltage detector 60 and the current detector 62. The analyzer 64 scales the outputs of the voltage and current detectors 60, 62 in a ratio such that they would be equal under nominal load conditions, then adds them together. The analyzer output reflects the amplitude of the forward power. An optional power controller 66 may receive the analyzer output and apply it to the power supply to control the forward power.

Figure 6A:
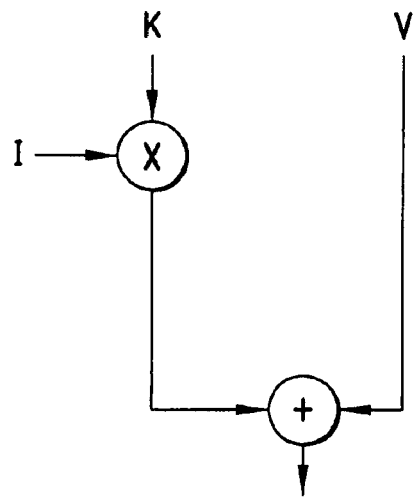
FIGS. 6A–C illustrate embodiments of the analyzer shown in FIGS. 3, 4, and 5.
Figure 6B:
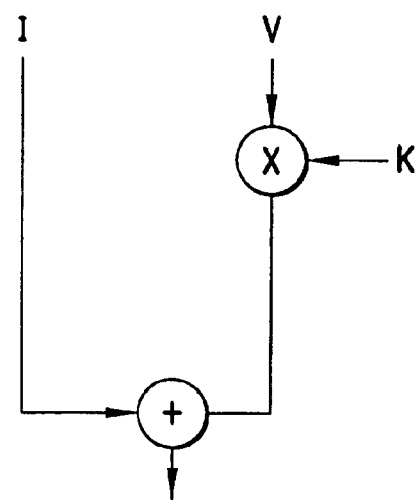
Figure 6C:
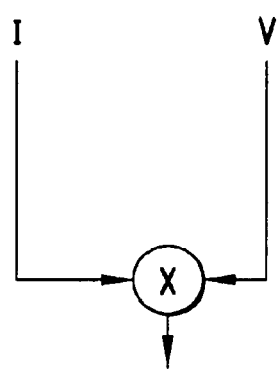

FIGS. 6A–C illustrate embodiments of the analyzer shown in FIGS. 3, 4, and 5.

In FIG. 6A, the output of the current detector 12b, shown in FIG. 3, or the first voltage detector 38, shown in FIG. 4, or the output of the current detector 62 of FIG. 5 is scaled. A summation node receives the scaled signal and the voltage. The output of the summation node reflects the amplitude of the power.

In FIG. 6B, the output of the voltage detector 16, shown in FIG. 3, or the second voltage detector 44, shown in FIG. 4, or the voltage detector 60 shown in FIG. 5 is scaled. A summation node receives the scaled voltage signal and the voltage. The output of the summation node reflects the amplitude of the power.

In FIG. 6C, the outputs of the detectors, e.g. current detector 12b and voltage detector 16 in FIG. 3 or first and second voltage detectors 38, 44 of FIG. 4, or current detector 62 and voltage detector 60 of FIG. 5 are received by a multiplication node. The output of the multiplication node reflects the power.

What is claim is:

1. A detector comprising:

an amplifier, connected between the power supply and ground, including a current detector generating a current signal, having an amplifier output;

voltage detector, interposing the amplifier output and ground, generating a voltage signal;

a matching circuit, connected to the amplifier output;

a load, interposing the matching circuit and ground;

an analyzer, receiving the current and voltage signals, generating an analyzer output that reflects a power parameter including,
   a multiplication node, receiving one of the current and voltage signals, generating a scaled signal, and
   an arithmetic node, receiving the scaled signal and the other of the current and voltage signals, generating the output that reflects the power parameter: and a gain control receiving the analyzer output electrically connected to the amplifier.

2. A detector, as defined in claim 1, wherein the power parameter is total power.

3. A detector, as defined in claim 1, wherein the power parameter is the amplitude of total power.

4. A detector, as defined in claim 1, the analyzer comprising a multiplication node, receiving the current and voltage detected signals, generating the analyzer output that reflects the power parameter.

* * * * *